United States Patent
Lee et al.

(10) Patent No.: US 9,460,766 B2
(45) Date of Patent: Oct. 4, 2016

(54) MEMORY DEVICE, AND MEMORY SYSTEM INCLUDING THE SAME

(71) Applicant: Samsung Electronics Co., Ltd., Suwon-si (KR)

(72) Inventors: Tae-Yoon Lee, Buscan (KR); Myeong-O Kim, Suwon-si (KR); Kyo-Min Sohn, Yongin-si (KR); Sang-Joon Hwang, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/801,707

(22) Filed: Jul. 16, 2015

(65) Prior Publication Data

US 2016/0071561 A1    Mar. 10, 2016

(30) Foreign Application Priority Data

Sep. 5, 2014  (KR) .......................... 10-2014-0118536

(51) Int. Cl.
| | |
|---|---|
| *G11C 7/00* | (2006.01) |
| *G11C 7/12* | (2006.01) |
| *G11C 11/4076* | (2006.01) |
| *G11C 11/4094* | (2006.01) |

(52) U.S. Cl.
CPC ............. *G11C 7/12* (2013.01); *G11C 11/4076* (2013.01); *G11C 11/4094* (2013.01)

(58) Field of Classification Search
USPC .................................. 365/203, 230.03, 233.1
See application file for complete search history.

(56) References Cited

U.S. PATENT DOCUMENTS

| | | | | |
|---|---|---|---|---|
| 6,314,028 | B1 * | 11/2001 | Kono | .............. G11C 7/065 365/189.09 |
| 6,507,526 | B2 | 1/2003 | Ohtake | |
| 6,628,566 | B2 | 9/2003 | Jeong | |
| 7,142,468 | B2 | 11/2006 | Kato et al. | |
| 7,184,342 | B2 | 2/2007 | Seo | |
| 8,339,872 | B2 | 12/2012 | Yun et al. | |
| 2002/0105844 | A1* | 8/2002 | Leung | .............. G11C 7/22 365/222 |

FOREIGN PATENT DOCUMENTS

| | | |
|---|---|---|
| KR | 10-2003-0088956 | 11/2003 |
| KR | 10-2007-0009821 | 1/2007 |
| KR | 10-2008-0040218 | 5/2008 |
| KR | 10-2009-0045673 | 5/2009 |
| KR | 10-2010-0011309 | 2/2010 |
| KR | 10-2010-0043490 | 4/2010 |
| KR | 10-2011-0060416 | 6/2011 |

* cited by examiner

*Primary Examiner* — Vu Le
(74) *Attorney, Agent, or Firm* — Muir Patent Law, PLLC

(57) ABSTRACT

A memory device may include a pre-charge control circuit, an active control circuit, and a driver circuit. The pre-charge control circuit may be configured to receive an active command after receiving a pre-charge command for a first bank, determine whether or not a pre-charge operation for the first bank has ended when receiving the active command, and generate an active instruction signal according to a result of the determination. The active control circuit may be configured to generate an active control signal for an active operation according to the active instruction signal. The driver circuit may be configured to control an active operation according to the active control signal.

20 Claims, 18 Drawing Sheets

FIG. 8
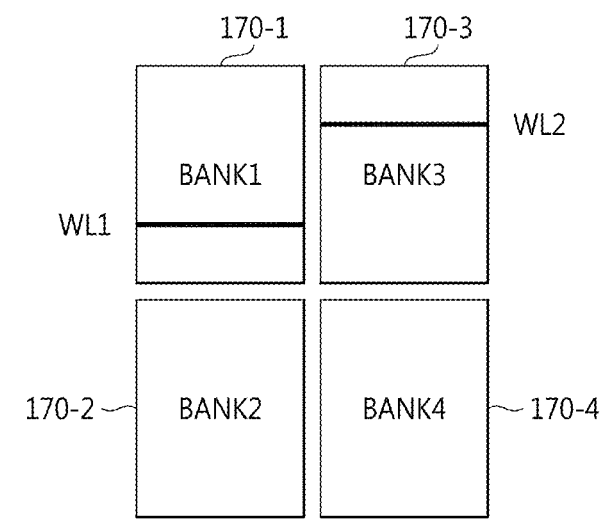
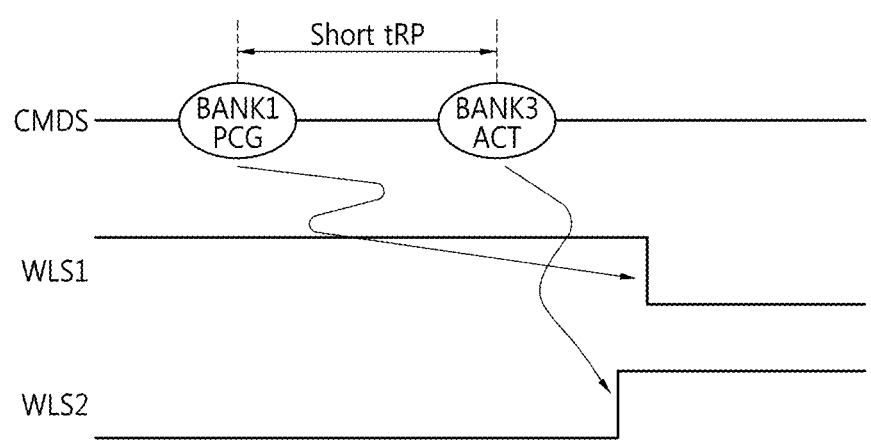

MEMORY DEVICE, AND MEMORY SYSTEM INCLUDING THE SAME

CROSS-REFERENCE TO RELATED APPLICATIONS

This application claims priority under 35 U.S.C. §119(a) to Korean Patent Application No. 10-2014-0118536 filed on Sep. 5, 2014, the disclosure of which is hereby incorporated by reference in its entirety.

BACKGROUND

As an integration of a memory device is increased, the memory device may have a multiple bank structure including a plurality of banks A pre-charge operation on the memory device including a plurality of banks may include a pre-charge operation of performing a pre-charge on each bank and/or an all bank pre-charge operation of performing the pre-charge on all banks at the same time. The pre-charge operation may be performed by applying a bank address for a bank to be pre-charged according to a pre-charge command to a memory device.

When an active command is input into the memory device, the memory device may enable a word line, and read or write data by connecting a bit line and a cell capacitor through a cell transistor. Then, when a pre-charge command is input into the memory device, the memory device turns off the cell transistor by disabling an enabled word line after a given delay time, and disconnects the bit line from the cell capacitor. At this time, time until the word line is disabled after receiving the pre-charge command is constantly set, but the time can vary with a voltage, a temperature, a process distribution, and the like.

When the time until the word line is disabled after receiving the pre-charge command becomes longer due to a voltage, a temperature, a process distribution, and the like, the memory device may perform an active operation in a state where a bit line is not properly pre-charged. On the other hand, when the time until the word line is disabled after receiving the pre-charge command becomes shorter due to a voltage, a temperature, a process distribution, and the like, time until the word line is enabled is reduced, and thereby data write time of the cell capacitor may be reduced.

SUMMARY

Various example embodiments may provide a memory device for and method of performing an active operation after checking whether or not a pre-charge operation has ended, and increasing cell data write time, and a memory system including the same.

According to example embodiments, a memory device including a plurality of banks includes a pre-charge control circuit, an active control circuit, and a driver circuit. The pre-charge control circuit is configured to receive an active command after receiving a pre-charge command for a first bank of the plurality of banks, determine whether or not a pre-charge operation for the first bank has ended when receiving the active command, and generate an active instruction signal according to a result of the determination. The active control is configured to generate an active control signal for an active operation according to the active instruction signal. The driver circuit is configured to control the active operation according to the active control signal.

According to example embodiments, a memory device including a plurality of memory cells connected to a plurality of word lines includes a pre-charge control circuit and an active control circuit. The pre-charge control circuit is configured to receive a pre-charge command and an active command received after the pre-charge command, and inactivate a first word line of the plurality of word lines. The active control circuit is configured to activate the first word line or a second word line of the plurality of word lines in response to the active command. The pre-charge control circuit is configured to inactivate the first word line at variable times based on a time of receiving the active command.

According to example embodiments, a memory device including a memory cell array having a plurality of memory cells connected to a plurality of word lines includes a pre-charge control circuit and an active control circuit. The pre-charge control circuit is configured to receive a pre-charge command and an active command received after the pre-charge command, and inactivate a first word line of the plurality of word lines. The active control circuit is configured to activate the first word line or a second word line of the plurality of word lines in response to the active command. The pre-charge control circuit is configured such that a time for inactivating the first word line is variable based on a location of memory cells connected to the second word line.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 8 is a conceptual diagram which describes the operations of banks shown in FIG. 1 according to another exemplary embodiment of the present inventive concepts;

DETAILED DESCRIPTION OF THE EMBODIMENTS

Figure 1:
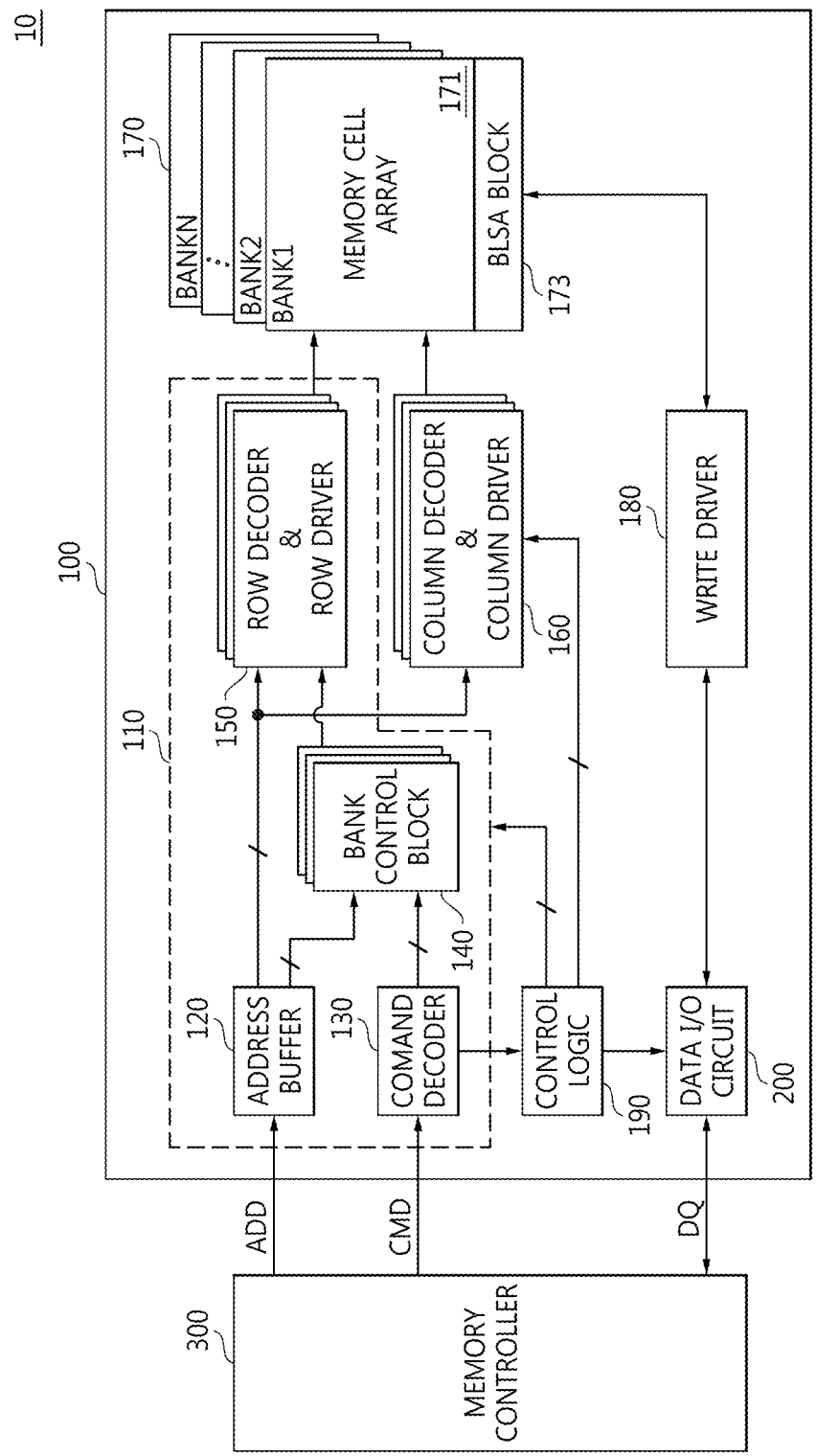
FIG. 1 is a schematic block diagram of a memory system according to an exemplary embodiment of the present inventive concepts.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Embodiments of the present disclosure relate to a memory device, and more particularly to a memory device for and a method of performing an active operation after checking whether or not a pre-charge operation has ended, and increasing cell data write time, and a memory system including the same.

It will be understood that, although the terms first, second, third etc. may be used herein to describe various elements, these elements should not be limited by these terms. Unless indicated otherwise, these terms are only used to distinguish one element from another. Thus, a first element discussed below could be termed a second element without departing from the teachings of the present disclosure. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). However, the term "contact" refers to direct contact, unless the context indicates otherwise.

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms such as "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic block diagram of a memory system according to an exemplary embodiment of the present inventive concepts. Referring to FIG. 1, a memory system 10 may include a memory device 100 and a memory controller 300. The memory device 100 may include an operating control circuit 110, a plurality of column decoders and column drivers 160, a plurality of banks 170 (e.g., BANK1, BANK2, . . . , and BANKN), a write driver 180, a control logic 190, and a data I/O circuit 200.

The operating control circuit 110 may include an address buffer 120, a command decoder 130, a plurality of bank control blocks 140, and a plurality of row decoders and row drivers 150.

The address buffer 120 may receive an address ADD from the memory controller 300 and store the address ADD, and transmit the address ADD to each of the plurality of bank control blocks 140, the plurality of row decoders and row drivers 150, and the plurality of column decoders and column drivers 160 according to a control of the control logic 190. The address ADD may include address information on a target of an operation, e.g., a bank BANK1 of the plurality of banks or sub-blocks included in the bank BANK1, and/or addresses of memory cells included in the sub-blocks. For example, the address ADD may include a bank address BA, a row address RA, and/or a column address CA.

The command decoder 130 receives a command CMD from the memory controller 300 and decodes the command CMD, thereby outputting an active command ACT and/or a pre-charge command PCG to each of the plurality of bank control blocks 140. According to an exemplary embodiment, the command decoder 130 may decode the command CMD generated in the memory device 100 and output the active command ACT and/or the pre-charge command PCG.

The command decoder 130 may transmit the active command ACT and/or the pre-charge command PCG to the control logic 190 according to a control of the control logic 190. According to an exemplary embodiment, the command decoder 130 may include a command buffer (not shown) which stores a command CMD. The command CMD may mean a signal determined by a combination of a plurality of signals (e.g., a chip select (CS), a row address strobe (RAS), a column address strobe (CAS), and/or a write enable (WE).

Each of the plurality of bank control blocks 140 receives an address ADD from the address buffer 120, and receives a command CMD from the command decoder 130, thereby transmitting control signals ACS and/or PCS to each of the plurality of column decoders and column drivers 160 and each of the plurality of row decoders and row drivers 150. Each of the plurality of bank control blocks 140 may perform an operation of selecting one of the plurality of banks 170 according to a control of the control logic 190. According to an exemplary embodiment, the control logic 190 may perform an operation of directly selecting one of the plurality of banks 170. According to an exemplary embodiment, the plurality of bank control blocks 140 may be embodied in one bank control block.

Each of the plurality of row decoders and row drivers 150 may select one of word lines based on the address ADD output from the address buffer 120, and transmit a control signal controlling a selected word line to each of the plurality of banks 170. According to an exemplary embodiment, the plurality of row decoders and row drivers 150 may be embodied in one row decoder and row driver.

Each of the plurality of column decoders and column drivers 160 may select one of bit lines based on the address ADD output from the address buffer 120, and transmit a control signal controlling a selected bit line to each of the plurality of banks 170. According to an exemplary embodiment, the plurality of column decoders and column drivers 160 may be embodied in one column decoder and column driver.

Each of the plurality of banks 170 may include a memory cell array 171 and a bit line sense amp (BLSA) block 173. Each of the plurality of banks 170 may be embodied in different layers or embodied in the same layer.

The memory cell array 171 includes word lines, bit lines, and memory cells each connected to each of the word lines and each of the bit lines. The memory cells may store data of at least one bit or more. The memory cells may be embodied in a non-volatile memory which can store data regardless of presence or absence of a power supply, or a volatile memory which can store data while power is supplied, and a method of physically fuse-cutting data using a laser or a method of electrically programming and storing data may be used.

For example, the memory cells may be a dynamic random access memory (DRAM), a static random access memory (SRAM), a synchronous dynamic random access memory (SDRAM), an electrically erasable programmable read-only memory (EEPROM), a flash memory, a magnetic RAM (MRAM), a conductive bridging RAM (CBRAM), a ferroelectric RAM (FeRAM), a phase change RAM (PRAM), or a resistive RAM (RRAM or ReRAM).

The BLSA block 173 may include one or more bit line sense amplifiers, and may sense-amplify a signal output from a bit line pair using the one or more bit line sense amplifiers.

The write driver 180 may generate read data corresponding to a sense-amplified signal from the BLSA block 173, and transmit the read data to the data I/O circuit 200. The control logic 190 may control an entire operation of the memory device 100. According to an exemplary embodiment, the control logic 190 may include a clock generator (not shown) and a mode register set (MRS) circuit (not shown).

The data I/O circuit 200 may transmit or receive a data signal DQ to or from the memory controller 300 according to a control of the control logic 190. The memory controller 300 may transmit various types of commands CMD for controlling an operation of the memory device 100, and addresses ADD of the plurality of banks 170 which perform an active operation, a pre-charge operation, a read operation, and a write operation to the memory device 100. In addition, the memory controller 300 may transmit write data to be written in the plurality of banks 170 to the memory device 100, and receive read data from the memory device 100.

Figure 2:
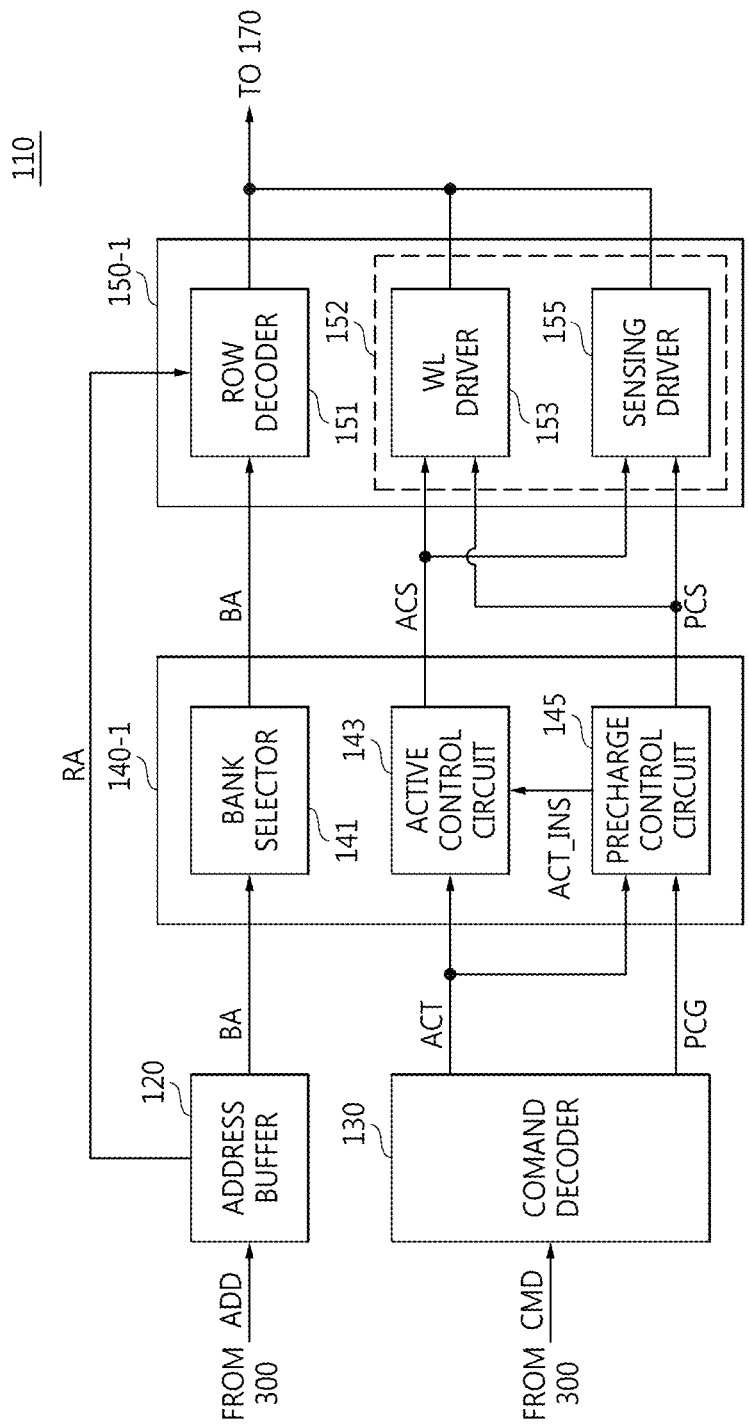
FIG. 2 is a block diagram of an operating control circuit shown in FIG. 1 according to example embodiments.

FIG. 2 is a block diagram of the operating control circuit shown in FIG. 1 according to example embodiments. Referring to FIGS. 1 and 2, one bank control block 140-1 of the plurality of bank control blocks 140 may include a bank selector 141, an active control circuit 143, and a pre-charge control circuit 145. The bank selector 141 may receive a bank address BA from the address buffer 120, and activate a corresponding row decoder among a plurality of row decoders included in the plurality of row decoders and row drivers 150. At this time, the corresponding row decoder may designate a specific row of a corresponding bank by receiving a row address RA from the address buffer 120.

The active control circuit 143 may receive an active command ACT for a first bank (e.g., BANK1) of the plurality of banks 170 from the command decoder 130, and receive an active instruction signal ACT_INS from the pre-charge control circuit 145. The active control circuit 143 may generate an active control signal ACS for the first bank, e.g., BANK1, according to the active instruction signal ACT_INS, and transmit the active control signal ACS to a driver block (or, a driver circuit) 152. As used herein, a "block" may refer to a "circuit."

According to an exemplary embodiment, the active control circuit 143 may perform a pre-charge operation on the first bank, e.g., BANK1, and then generate an active control signal ACS which instructs to perform an active operation on the first bank, e.g., BANK1, when the active instruction signal ACT_INS is at a first level. According to another exemplary embodiment, the active control circuit 143 may generate an active control signal ACS which instructs to immediately perform the active operation on the first bank, e.g., BANK1, when the active instruction signal ACT_INS is at a second level different from the first level.

The pre-charge control circuit 145 may receive an active command ACT and a pre-charge command PCG from the command decoder 130, and generate a pre-charge end signal PCG_END. The pre-charge end signal PCG_END will be described in detail referring to FIGS. 4 and 5.

The pre-charge control circuit 145 may receive an active command ACT for the first bank (e.g., BANK1) after receiving a pre-charge command PCG for the first bank (e.g., BANK1), determine whether or not a pre-charge operation on the first bank (e.g., BANK1) has ended when receiving the active command ACT, and generate an active instruction signal ACT_INS according to a result of the determination.

The pre-charge control circuit 145 may not determine whether or not the pre-charge operation on the first bank (e.g., BANK1) has ended when receiving an active command for a second bank (e.g., BANK2) of the plurality of banks 170 after receiving a pre-charge command PCG for the first bank (e.g., BANK1). For example, the pre-charge control circuit 145 may determine whether or not a pre-charge operation on a corresponding bank has ended for each bank.

The pre-charge control circuit 145 may generate a pre-charge control signal PCS for the first bank (e.g., BANK1) according to the pre-charge command PCG, and transmit the pre-charge control signal PCS to the driver block 152.

The pre-charge control circuit 145 may compare a first time point T_ACT at which an active command ACT for the first bank (e.g., BANK1) is received from the command decoder 130 with a second time point T_PCE at which a pre-charge end signal PCG_END for the first bank (e.g., BANK1) is generated, and generate an active instruction signal ACT_INS according to a result of the comparison. For example, the pre-charge control circuit 145 may check whether or not a pre-charge operation has ended with a pre-charge end signal PCG_END when receiving the active command ACT, and transmit a generated active instruction signal ACT_INS to the active control circuit 143 according to a result of the check.

According to an exemplary embodiment, when the first time point T_ACT at which an active command ACT for the first bank (e.g., BANK1) is received from the command decoder 130 earlier than the second time point T_PCE at which a pre-charge end signal PCG_END for the first bank (e.g., BANK1) is received, the pre-charge control circuit 145 may generate an active instruction signal ACT_INS which instructs to perform an active operation on the first bank (e.g., BANK1) after performing a pre-charge operation on the first bank (e.g., BANK1).

According to another exemplary embodiment, when the first time point T_ACT at which an active command ACT for the first bank (e.g., BANK1) is received from the command decoder 130 later than the second time point T_PCE at which a pre-charge end signal PCG_END for the first bank (e.g., BANK1) is received, the pre-charge control circuit 145 may generate an active instruction signal ACT_INS which instructs to immediately perform the active operation on the first bank, e.g., BANK1, according to the active command ACT.

The row decoder and row driver 150-1 may include a row decoder 151 and a driver block 152, and the driver block 152 may include a word line driver 153 and a sensing driver 155. The row decoder and row driver 150-1 may control a pre-charge operation or an active operation on a corresponding bank (e.g., BANK1) among the plurality of banks 170 using a bank address BA, a row address RA, an active control signal ACS, and/or a pre-charge control signal PCS.

The row decoder 151 may receive the bank address BA and the row address RA, and select a memory cell corresponding to the bank address BA and the row address RA. The word line driver 153 may enable (or, activate) a word line signal WLS according to the active control signal ACS received from the active control circuit 143, and disable (or, inactivate) the word line signal WLS according to the pre-charge control signal PCS received from the pre-charge control circuit 145.

The sensing driver 155 may enable a bit line sensing signal PSA_EN and/or NSA_EN according to the active control signal ACS received from the active control circuit 143, and disable the bit line sensing signal PSA_EN and/or NSA_EN according to the pre-charge control signal PCS received from the pre-charge control circuit 145.

Figure 3:
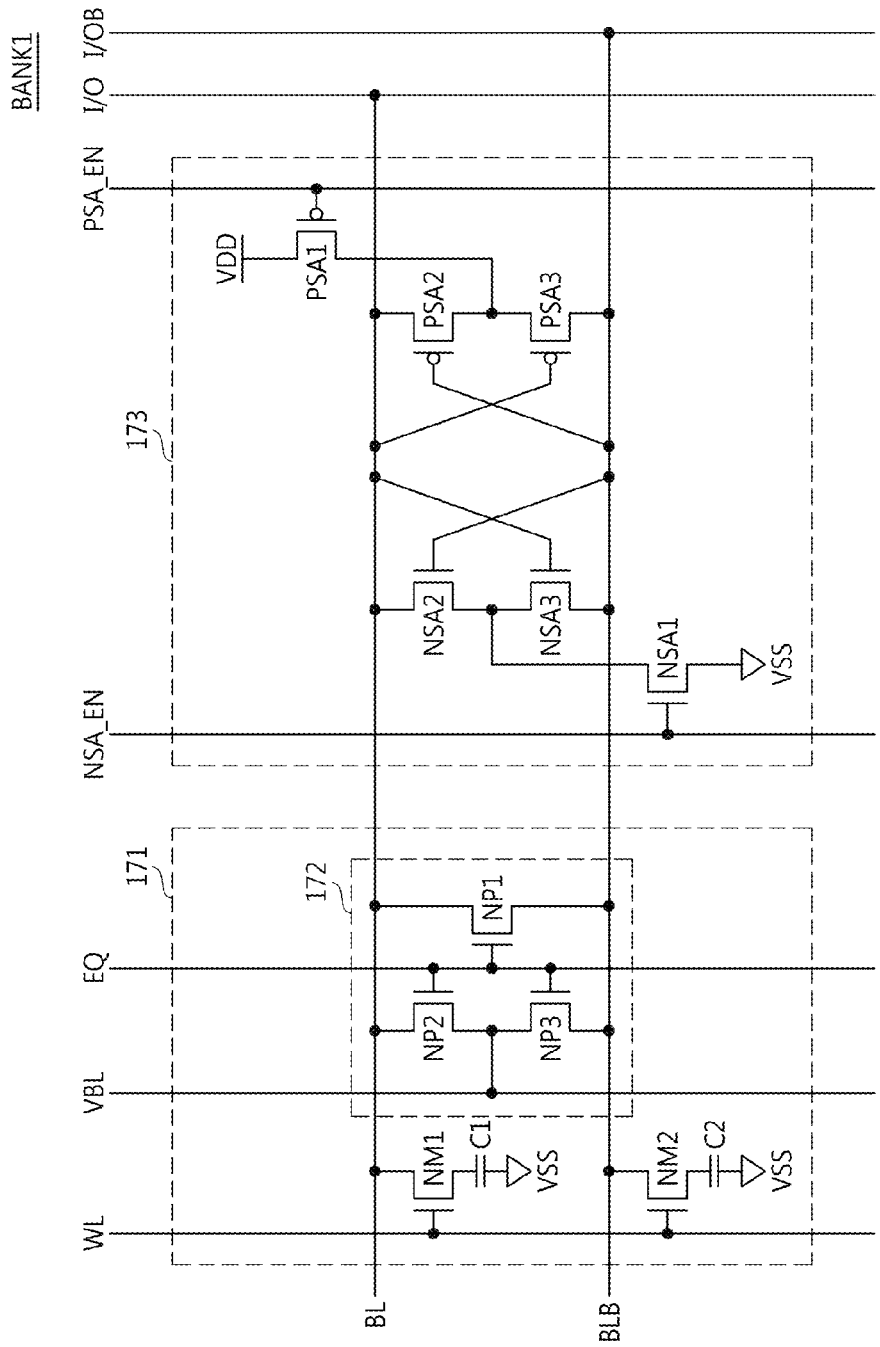
FIG. 3 is a schematic internal circuit diagram of a bank of a memory device shown in FIG. 1.

FIG. 3 is a schematic internal circuit diagram of a bank of a memory device shown in FIG. 1. Referring to FIGS. 1 and 3, the memory cell array 171 of the first bank BANK1 may include a first memory cell and a second memory cell.

The first memory cell includes a first capacitor C1 for storing first data, and a first transistor NM1 which connects the first capacitor C1 and a bit line BL in response to the word line signal WLS supplied to a word line WL. The second memory cell includes a second capacitor C2 for storing second data, and a second transistor NM2 which connects the second capacitor C2 and a complementary bit line BLB in response to the word line signal WLS.

The memory cell array 171 may include a pre-charge circuit 172 connected between the bit line pair BL and BLB.

The pre-charge circuit 172 may pre-charge the bit line pair BL and BLB with a pre-charge voltage in response to the pre-charge enable signal EQ. The pre-charge voltage may be supplied from a pre-charge voltage supply line VBL. When transistors NP1, NP2, and NP3 included in the pre-charge circuit 172 are switched on by the pre-charge enable signal EQ, the pre-charge voltage supplied from the pre-charge voltage supply line VBL may be supplied to the bit line pair BL and BLB. Accordingly, the bit line pair BL and BLB is charged with the pre-charge voltage. According to an exemplary embodiment, the pre-charge voltage may be a power voltage VDD or 1/2 of the power voltage (VDD/2); however, the pre-charge voltage is not limited thereto.

A pre-charge of a BLSA block 173 means a pre-charge of the bit line pair (BL and BLB) connected to the BLSA block 173. For example, the pre-charge circuit 172 may pre-charge the bit line pair BL and BLB.

The BLSA block 173 may operate in response to a bit line sensing signal PSA_EN and/or NSA_EN. The BLSA block 173 may include a plurality of NMOS transistors NSA1 to NSA3 and a plurality of PMOS transistors PSA1 to PSA3.

The PMOS transistor PSA1 connected to a first node which supplies the power voltage VDD may supply the power voltage VDD to the BLSA block 173, and a transistor NSA1 connected to a second node which supplies a ground voltage VSS may supply the ground voltage VSS to the BLSA block 173. For example, when it is assumed that data "1" is transmitted through the bit line BL, and data "0" is transmitted through the complementary bit line BLB, each of the NMOS transistor NSA3 and the PMOS transistor PSA2 is switched on.

When each of the transistors PSA1 and NSA1 is switched on, the ground voltage VSS is supplied to the complementary bit line BLB through the NMOS transistor NSA3, and the power voltage VDD is supplied to the bit line BL through the PMOS transistor PSA2. Accordingly, the bit line BL is charged with the power voltage VDD, and the complementary bit line BLB is discharged to the ground voltage VSS, a bit line sensing amplifier in the BLSA block 173 may amplify a voltage difference between the bit line pair BL and BLB.

The BLSA block 173 outputs an amplified voltage difference (or signal) through a data input/output line pair (I/O and I/OB). According to an exemplary embodiment, the BLSA block 173 may read/write each of sense-amplified signals from/in each of memory cells connected to the bit line pair BL and BLB.

Figure 4:
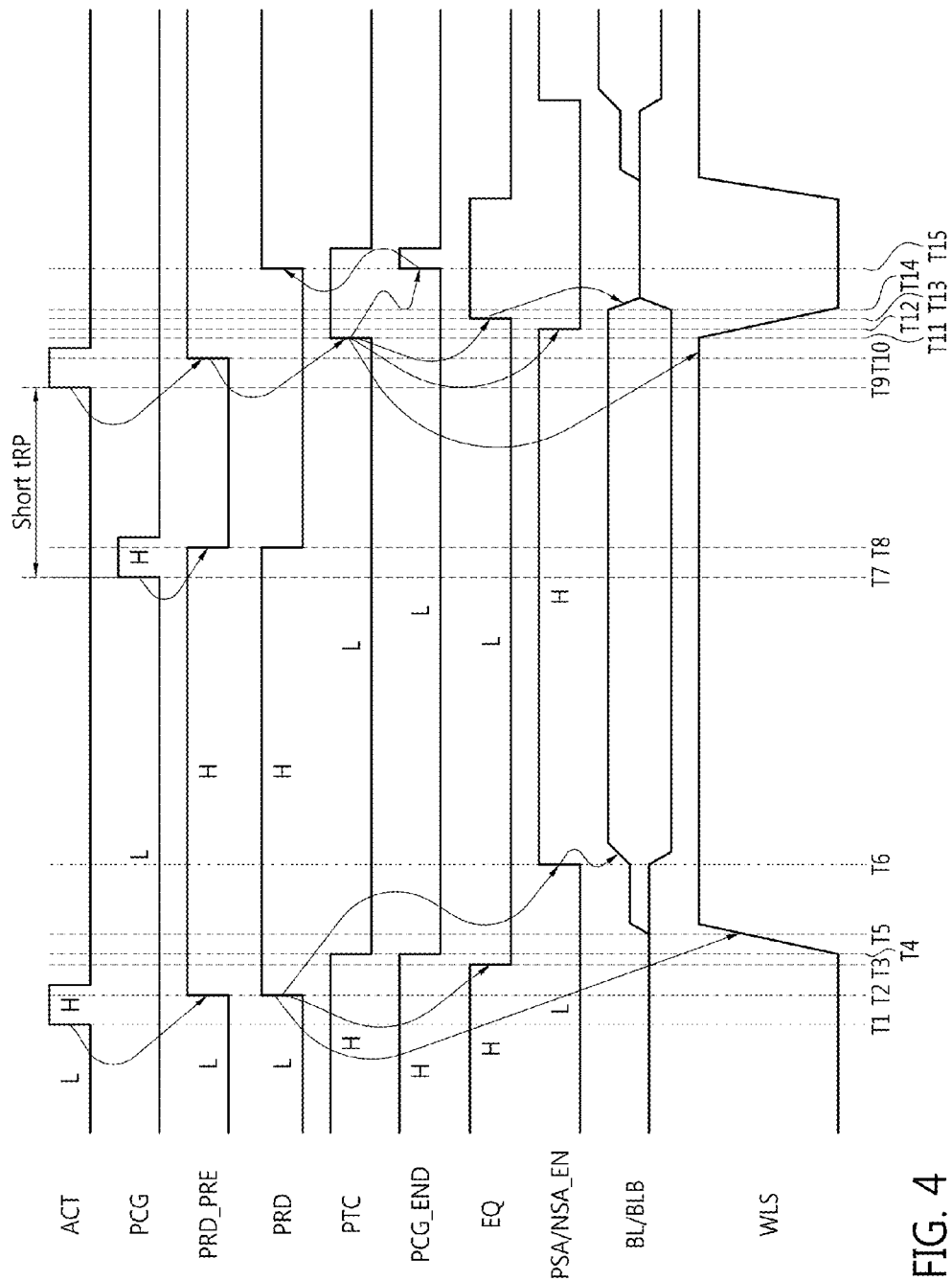
FIG. 4 is a timing diagram illustrating an active operation and a pre-charge operation performed by the memory device shown in FIG. 1 according to example embodiments.
Figure 5:
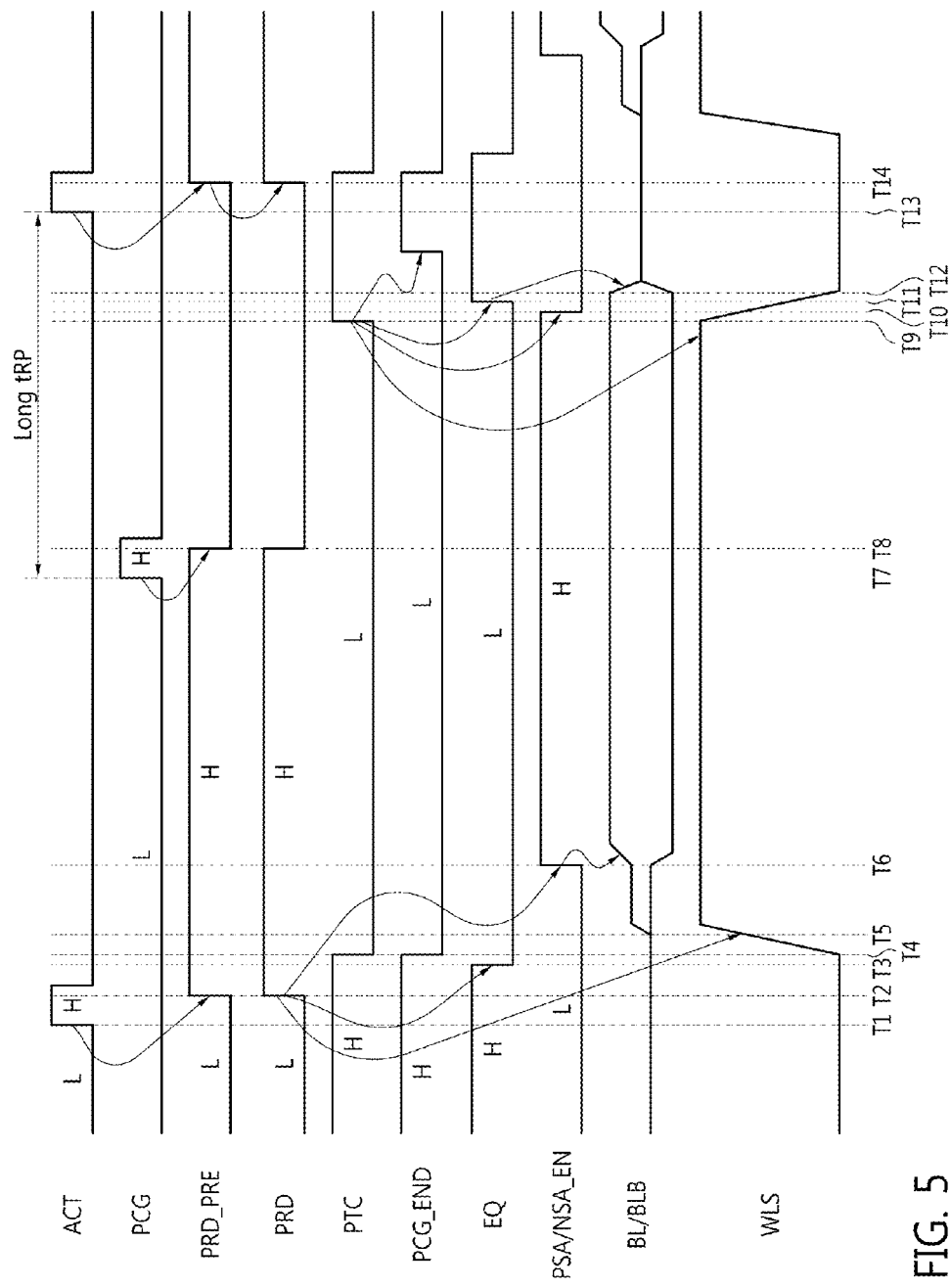
FIG. 5 is a timing diagram illustrating an active operation and a pre-charge operation performed by the memory device shown in FIG. 1 according to example embodiments.

For convenience of description in FIG. 3, a bank BANK1 is shown which includes two memory cells, one pre-charge circuit 172, and the BLSA block 173 configured to have one bit line sense amplifier. FIG. 4 is a timing diagram illustrating an active operation and a pre-charge operation performed by the memory device shown in FIG. 1 according to example embodiments. Terms shown in FIGS. 4 and 5 are as follows.

An active interval signal PRD is a signal which shows an active interval of a corresponding bank performing an active operation, a pre-charge state signal PTC is a signal which shows a state (e.g., a start of the pre-charge operation) of a pre-charge operation on the corresponding bank which performs the pre-charge operation, an active pre-charge interval signal PRD_PRE is a signal which shows an interval between a reception of an active command ACT and a reception of a pre-charge command PCG by the corresponding bank which performs the active operation and the pre-charge operation, and a pre-charge end signal PCG_END is a signal which shows an end of the pre-charge operation on the corresponding bank which performs the pre-charge operation. For example, a pre-charge operation may start by the pre-charge state signal PTC having a high level H.

In example embodiments, the active control signal ACS of FIG. 2 may include the active interval signal PRD, and the pre-charge control signal PCS may include the pre-charge state signal PTC, the active pre-charge interval signal PRD_PRE, and the pre-charge end signal PCG_END. In one embodiment, the active instruction signal ACT_INS of FIG. 2 may be generated in response to the pre-charge end signal PCG_END.

Each of the first time point T1 to a fifteenth time point T15 in the present specification may mean one time point or an interval between two time points.

Referring to FIGS. 1 to 4, at a first time point T1, each of the active control circuit 143 and the pre-charge control circuit 145 may receive an active command ACT from the command decoder 130, and the active command ACT may transit from a low level L to a high level H. A second time point T2 to a sixth time point T6 show a procedure in which a memory device 100 starts the active operation according to the active command ACT.

At the second time pint T2, each of the active pre-charge interval signal PRD_PRE and the active interval signal PRD may transit from the low level L to the high level H in response to the active command ACT having the high level H. At a third time point T3, a pre-charge enable signal EQ may transit from the high level H to the low level L in response to the active interval signal PRD having the high level H.

At a fourth time point T4, the word line signal WLS may be enabled in response to the active interval signal PRD having the high level H, the pre-charge state signal PTC may transit from the high level H to the low level L, and the pre-charge end signal PCG_END may also transit from the high level H to the low level L. At a fifth time point T5, as the word line signal WLS is enabled, for example, a corresponding bit line BL is charged with the power voltage VDD, and a corresponding complementary bit line BLB may be discharged to the ground voltage VSS.

At a sixth time point T6, a bit line sensing signal PSA_EN and/or NSA_EN may transit from the low level L to the high level H in response to the active interval signal PRD having the high level H, and the BLSA block 173 may amplify a voltage difference between the bit line pair BL and BLB in response to the bit line sensing signal PSA_EN and/or NSA_EN having the high level H. At a seventh time point T7, the pre-charge control circuit 145 may receive the pre-charge command PCG from the command decoder 130, and the pre-charge command PCG may transit from the low level L to the high level H.

At a eighth time point T8, each of the active pre-charge interval signal PRD_PRE and the active interval signal PRD may transit from the high level H to the low level L in response to the pre-charge command PCG having the high level H. At a ninth time point T9, each of the active control circuit 143 and the pre-charge control circuit 145 may receive the active command ACT from the command decoder 130, and allow the active command ACT to transit from the low level L to the high level H.

In one embodiment, "Short tRP" means that a time between the seventh time point T7 at which the pre-charge command PCG is received and the ninth time point T9 at which the active command ACT is received is less than a reference time. Also, "Short tRP" in the present specification means that a pre-charge operation of the memory device 100 is not started (or, not performed) at a time point at which the active command ACT is received. For example, the word line signal WLS is enabled after a time point at which the memory device 100 receives the active command ACT.

A tenth time point T10 to a fifteenth time point T15 show a procedure in which the memory device 100 starts the pre-charge operation. At the tenth time point T10, the active pre-charge interval signal PRD_PRE may transit from the low level L to the high level H in response to the active command ACT having the high level H.

At an eleventh time point T11, the pre-charge state signal PTC may transit from the low level L to the high level H in response to the active pre-charge interval signal PRD_PRE having the high level H, and the word line signal WLS may be disabled in response to the pre-charge state signal PTC having the high level H. At a twelfth time point T12, the bit line sensing signal PSA_EN and/or NSA_EN may transit from the high level H to the low level L in response to the pre-charge state signal PTC having the high level H.

At a thirteenth time point T13, the pre-charge enable signal EQ may transit from the low level L to the high level H in response to the pre-charge state signal PTC having the high level H. At a fourteenth time point T14, the bit line pair BL and BLB may be pre-charged in response to the pre-charge enable signal EQ having the high level H.

At a fifteenth time point T15, the pre-charge end signal PCG_END may transit from the low level L to the high level H after a predetermined delay time in response to the pre-charge state signal PTC having the high level H, and the active interval signal PRD may transit from the low level L to the high level H in response to the pre-charge end signal PCG_END having the high level H. For example, the memory device 100 may check a level of the pre-charge end signal PCG_END, and perform the active operation when the pre-charge operation has ended according to a result of the check.

FIG. 5 is a timing diagram illustrating an active operation and a pre-charge operation performed by the memory device shown in FIG. 1 according to example embodiments. An operation of the memory device 100 from the first time point T1 to the eighth time point T8 in FIG. 5 is substantially the same as or similar to the operation of the memory device 100 between the first time point T1 and the eighth time point T8 in FIG. 4, and thereby a description thereof will be omitted.

Referring to FIGS. 1 to 5, unlike an operation of the memory device 100 between the ninth time point T9 and the fifteenth time point T15 in FIG. 4, when the memory device 100 receives the active command ACT after receiving the pre-charge command PCG between the ninth time point T9 and the fourteenth time point T14 in FIG. 5, the pre-charge operation is already in progress. Accordingly, the memory device 100 of FIG. 5 may immediately perform the active operation in response to the active command ACT without generating the pre-charge state signal PTC.

At the ninth time point T9, when the pre-charge control circuit 145 does not receive the active command ACT with an elapse of specific amount of delay time (e.g., a reference time) after receiving the pre-charge command PCG, the pre-charge state signal PTC may transit from the low level L to the high level H. In one embodiment, the reference time may have variable times by using, for example, a fuse circuit, a mode register set (MRS), or a delay circuit. For example, the word line signal WLS may be disabled in response to the pre-charge state signal PTC having the high level H.

At a tenth time point T10, the bit line sensing signal PSA_EN and/or NSA_EN may transit from the high level H to the low level L in response to the pre-charge state signal PTC having the high level H. At an eleventh time point T11, the pre-charge enable signal EQ may transit from the low level L to the high level H in response to the pre-charge state signal PTC having the high level H. At a twelfth time point T12, the bit line pair BL and BLB may be pre-charged in response to the pre-charge enable signal EQ having the high level H. The pre-charge end signal PCG_END may transit from a low level L to a high level H after a predetermined delay time in response to the pre-charge state signal PTC having the high level H. For example, when the pre-charge end signal PCG_END is a high level H a pre-charge operation for a corresponding word line may be ended, and when the pre-charge end signal PCG_END is a low level L the pre-charge operation for the corresponding word line may be in progress or not be started.

At a thirteenth time point T13, each of the active control circuit 143 and the pre-charge control circuit 145 may receive the active command ACT from the command decoder 130, and allow the active command ACT to transit from the low level L to the high level H. For example, "Long tRP" may mean a time between a seventh time point T7 at which the pre-charge command PCG is received and a thirteenth time point T13 at which the active command ACT is received, and the "Long tRP" may mean a time relatively longer than "Short tRP" shown in FIG. 4. In detail, when the active command ACT is received before the ninth time point T9 shown in FIG. 5, it may be called "Short tRP" and when the active command ACT is received after the ninth time point T9 shown in FIG. 5, it may be called "Long tRP". The "Long tRP" in the present specification means a case where pre-charge operation is in progress or has ended at a time point at which the memory device 100 receives the active command ACT. For example, the word line signal WLS may be disabled at a time point at which before the memory device 100 receives the active command ACT.

At a fourteenth time point T14, the active pre-charge interval signal PRD_PRE may transit from the low level L to the high level H in response to the active command ACT having the high level H, and the active interval signal PRD may transit from the low level L to the high level H in response to the active pre-charge interval signal PRD_PRE having the high level H.

In one embodiment, the pre-charge control circuit 145 of FIG. 2 may be configured to inactivate a corresponding word line (e.g., a first word line) at variable times based on a time of receiving the active command ACT.

In one embodiment, when the active command ACT is received after a reference time from receiving the pre-charge command PCG, the pre-charge control circuit 145 may be configured to inactivate the first word line in response to the pre-charge command PCG. When the active command ACT is received before the reference time from receiving the pre-charge command PCG, the pre-charge control circuit 145 may be configured to inactivate the first word line in response to the active command ACT. For example, the reference time may be a time between the seventh time point T7 and the ninth time point T9 shown in FIG. 5.

In one embodiment, when the active command ACT is received after the reference time from receiving the pre-charge command PCG, the pre-charge control circuit 145 may be configured to inactivate the first word line after a first delay time (e.g., the reference time) from receiving the pre-charge command PCG. When the active command ACT is received before the reference time from receiving the pre-charge command PCG, the pre-charge control circuit 145 may be configured to inactivate the first word line after a second delay time shorter than the first delay time from receiving the pre-charge command PCG.

Figure 6:
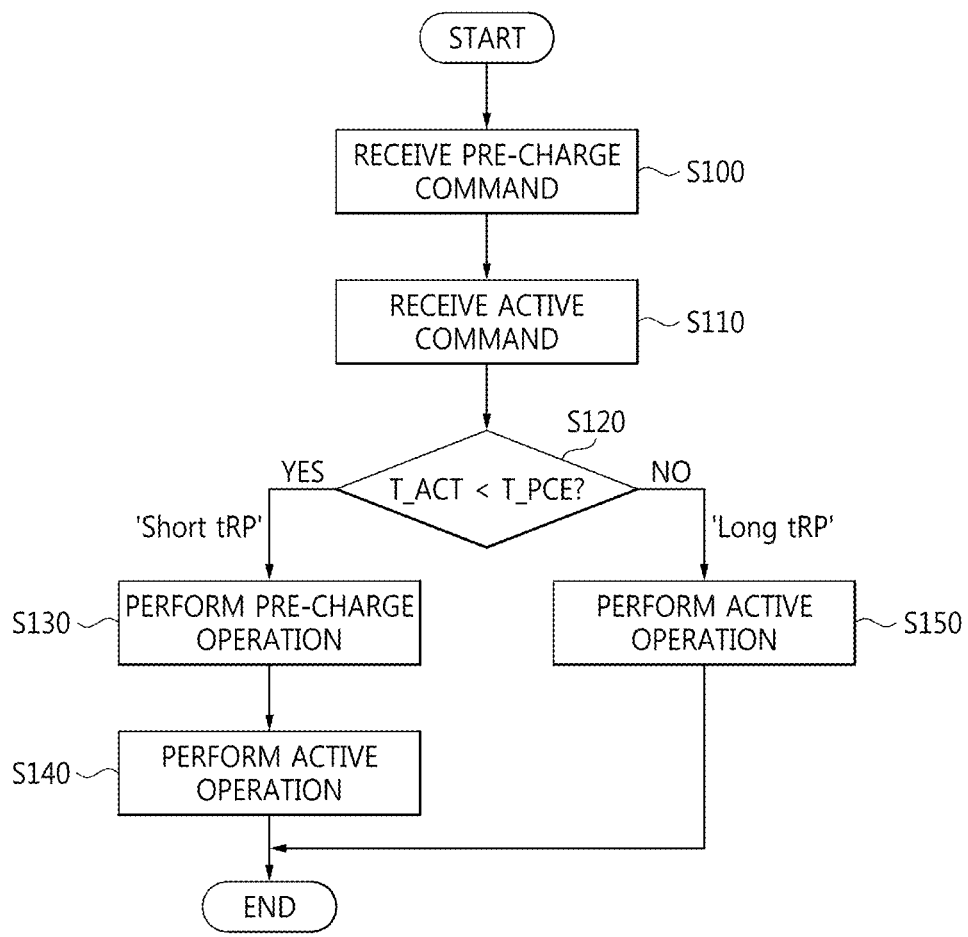
FIG. 6 is a flowchart for describing an operation of a bank shown in FIG. 1 according to an exemplary embodiment.

FIG. 6 is a flowchart for describing an operation of a bank shown in FIG. 1 according to an exemplary embodiment. Referring to FIGS. 1 to 6, one of the plurality of banks 170 may receive the pre-charge command PCG for the bank (S100), and receive the active command ACT for the bank (S110). The bank may compare the first time point T_ACT at which the active command ACT is received with the second time point T_PCE at which the pre-charge end signal PCG_END is received (S120).

According to a result of the comparison, when the first time T_ACT at which the active command ACT is received leads ahead of the second time point T_PCE at which the pre-charge end signal PCG_END is received (e.g., "Short tRP"), the bank may perform the pre-charge operation (S130), and then perform the active operation after the pre-charge operation has ended (S140). According to a result of the comparison, when the first time point T_ACT at which the active command ACT is received lags behind the second time point T_PCE at which the pre-charge end signal PCG_END is received (e.g., "Long tRP"), the bank may immediately perform the active operation according to the active command ACT (S150). For example, the memory device 100 (e.g., a pre-charge control circuit 145) may determine whether or not the pre-charge operation on the bank has ended at the first time point T_ACT at which the active command ACT is received, and perform the pre-charge operation and/or the active operation according to a result of the determination.

Figure 7:
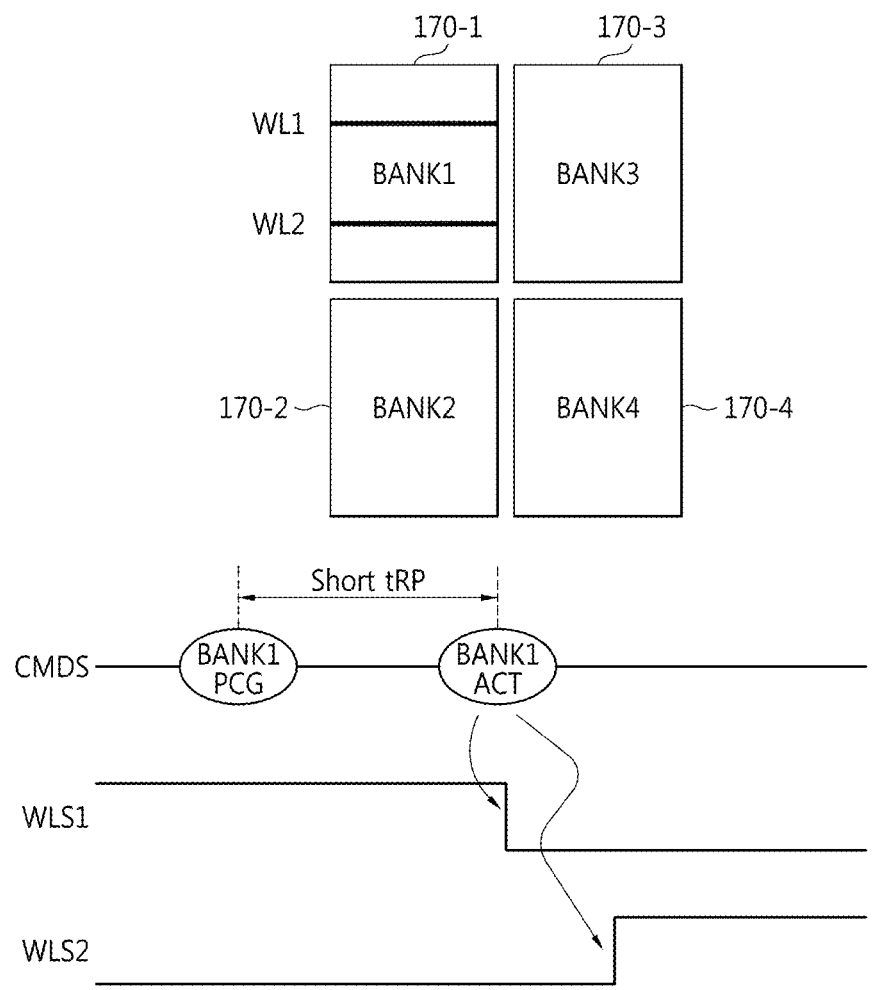
FIG. 7 is a conceptual diagram which describes operations of banks shown in FIG. 1 according to an exemplary embodiment of the present inventive concepts.

FIG. 7 is a conceptual diagram which describes operations of banks shown in FIG. 1 according to an exemplary embodiment of the present inventive concepts. FIG. 8 is a conceptual diagram which describes the operations of banks shown in FIG. 1 according to another exemplary embodiment of the present inventive concepts.

For convenience of description in FIGS. 7 and 8, it is assumed that the memory device 100 includes four banks 170-1, 170-2, 170-3, and 170-4. However, the present inventive concept is not limited thereto, but the memory device 100 may include one or more banks according to an exemplary embodiment.

"CMDS" means command signals PCG and/or ATC which the plurality of bank control blocks 140 receive from the command decoder 130. The command decoder 130 may control so that an active operation or a pre-charge operation may be performed for each bank by transmitting the active command ACT and/or the pre-charge command PCG to one of the four banks 170-1, 170-2, 170-3, and 170-4.

Referring to FIGS. 1 to 7, when a first bank 170-1 receives a first bank pre-charge command BANK1 PCG, and then receives a first bank active command BANK1 ACT in the "Short tRP", the first bank 170-1 may perform a pre-charge operation, and perform an active operation after the pre-charge operation has ended. Accordingly, a first word line signal WLS1 on a first word line WL1 of the first bank 170-1 may be disabled after receiving the first bank active command BANK1 ACT, and a second word line signal WLS2 on the first bank 170-2 may be enabled after the pre-charge operation on the first word line WL1 has ended. At this time, banks 170-2, 170-3, and 170-4 which do not receive the command signals PCG, and/or ACT do not perform the active operation and the pre-charge operation.

Referring to FIGS. 1 to 8, when the first bank 170-1 receives the first bank pre-charge command BANK1 PCG, and then the first bank 170-1 does not receive the first bank active command BANK1 ACT, the first bank 170-1 may not perform the pre-charge operation. According to an exemplary embodiment, the first bank 170-1 may perform the pre-charge operation with an elapse of time longer than a delay time of the related art. Accordingly, the first word line signal WLS1 on a first word line WL1 of the first bank 170-1 may be disabled with the elapse of time longer than the delay time of the related art.

Moreover, when the first bank 170-1 receives the first bank pre-charge command BANK1 PCG, and then a third bank 170-3 receives a third bank active command BANK3 ACT, the third bank 170-3 may perform the active operation. For example, the third bank 170-3 may perform the active operation and/or the pre-charge operation independently from the first bank 170-1.

Figure 9:
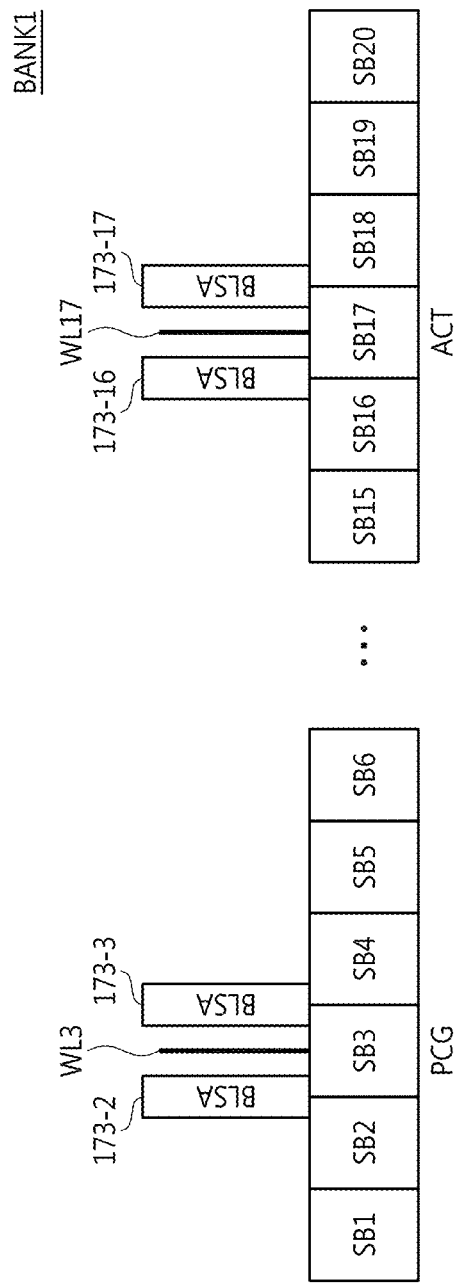
FIG. 9 is a conceptual diagram which describes operations of sub-blocks included in a bank according to an exemplary embodiment of the present inventive concepts.
Figure 10:
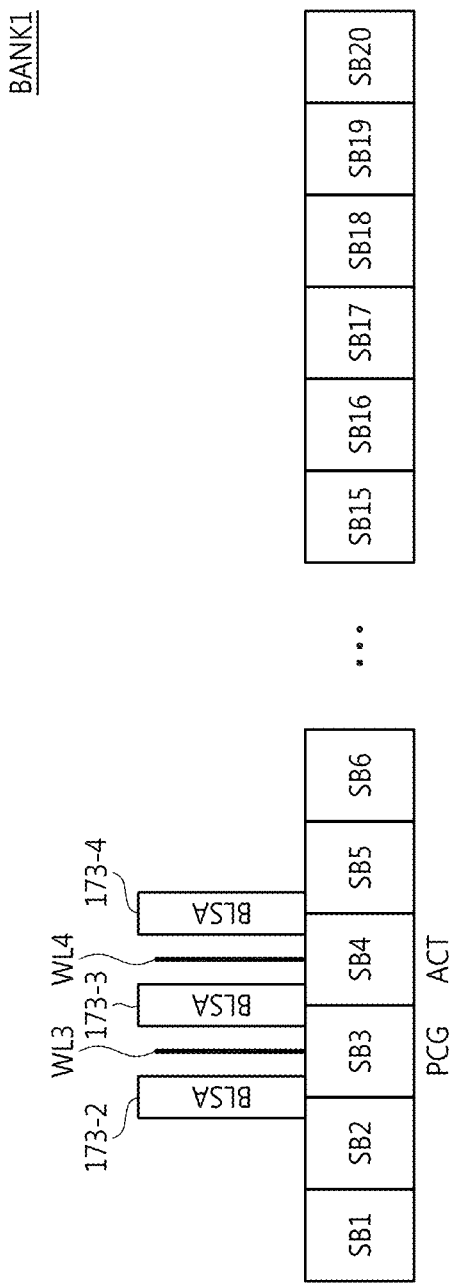
FIG. 10 is a conceptual diagram which describes the operations of sub-blocks included in a bank according to another exemplary embodiment of the present inventive concepts.

FIG. 9 is a conceptual diagram which describes operations of sub-blocks included in a bank according to an exemplary embodiment of the present inventive concepts. FIG. 10 is a conceptual diagram which describes the operations of sub-blocks included in a bank according to another exemplary embodiment of the present inventive concepts. For convenience of description in FIGS. 9 and 10, it is assumed that a first bank BANK1 includes 20 sub-blocks SB1 to SB20; however, the first bank BANK1 may include a different number of sub-blocks. Each of the sub-blocks (one of SB1 to SB20) is connected to a corresponding word line, and two adjacent sub-blocks may share one bit line sense amplifier BLSA.

The memory device 100 may enable a word line signal WLS of a word line (e.g., WL17) connected to a corresponding sub-block (e.g., SB17), and may read or write data by enabling the bit line sensing signal PSA_EN and/or NSA_EN when performing an active operation. Bit line sense amplifiers BLSA 173-16 and 173-17 may operate for memory cells connected to the word line WL17. The memory device 100 may disable the word line signal WLS of a word line (e.g., WL3) connected to a corresponding sub-block (e.g., SB3), and may pre-charge a bit line by disabling the bit line sensing signal PSA_EN and/or NSA_EN when performing a pre-charge operation.

Referring to FIGS. 1 to 10, each of the plurality of bank control blocks 140 may control the pre-charge operation and/or the active operation on each of the sub-blocks (one of SB1 to SB20) included in a bank. The pre-charge control circuit 145 may receive the active command ACT for a corresponding sub-block (e.g., SB1) after receiving the pre-charge command PCG for the corresponding sub-block (e.g., SB1), determine whether or not the pre-charge operation on the corresponding sub-block (e.g., SB1) has ended when receiving the active command ACT, and generate an active instruction signal ACT_INS according to a result of the determination.

According to an exemplary embodiment, the active command ACT may be a first active command for the first sub-block SB1. According to another exemplary embodiment, the active command ACT may be a second active command for a second sub-block SB2 adjacent to the first sub-block SB1.

The pre-charge control circuit 145 may generate a pre-charge control signal PCS for the first sub-block SB1 according to the pre-charge command PCG, and a driver block 152 may control the pre-charge operation on the first sub-block SB1 according to the pre-charge control signal PCS.

Referring to FIG. 9, when a third sub-block SB3 receives the pre-charge command PCG, and then a seventeenth sub-block SB17 receives the active command ACT, the third sub-block SB3 does not immediately perform the pre-charge operation, but performs the pre-charge operation with a specific amount of delay time. According to an exemplary embodiment, the third sub-block SB3 may not perform the pre-charge operation before the specific amount of delay time.

Referring to FIG. 10, a third sub-block SB3 and a fourth sub-block SB4 may share a bit line sense amplifier BLSA 173-3. For example, when the third sub-block SB3 receives the pre-charge command PCG for a third word line WL3, and then a fourth sub-block SB4 receives the active command ACT for a fourth word line WL4, memory cells connected to the third word line WL3 of the third sub-block SB3 may immediately perform a pre-charge operation in response to the active command ACT, and memory cells connected to the fourth word line WL4 of the fourth sub-block SB4 may perform the active operation after the pre-charge operation on the third word line WL3 has ended. According to an exemplary embodiment, when memory cells of the third sub-block SB3 have already ended the pre-charge operation when the fourth sub-block SB4 receives the active command ACT, memory cells of the fourth sub-block SB4 may immediately perform the active operation. For example, when a corresponding sub-block (e.g., SB3) which receives the pre-charge command PCG or a sub-block (e.g., SB2 or SB4) adjacent to the corresponding sub-block (e.g., SB3) receives the active command ACT, the corresponding sub-block (e.g., SB3) may determine whether or not the pre-charge operation has ended, and perform the active operation according to a result of the determination.

Figure 11:
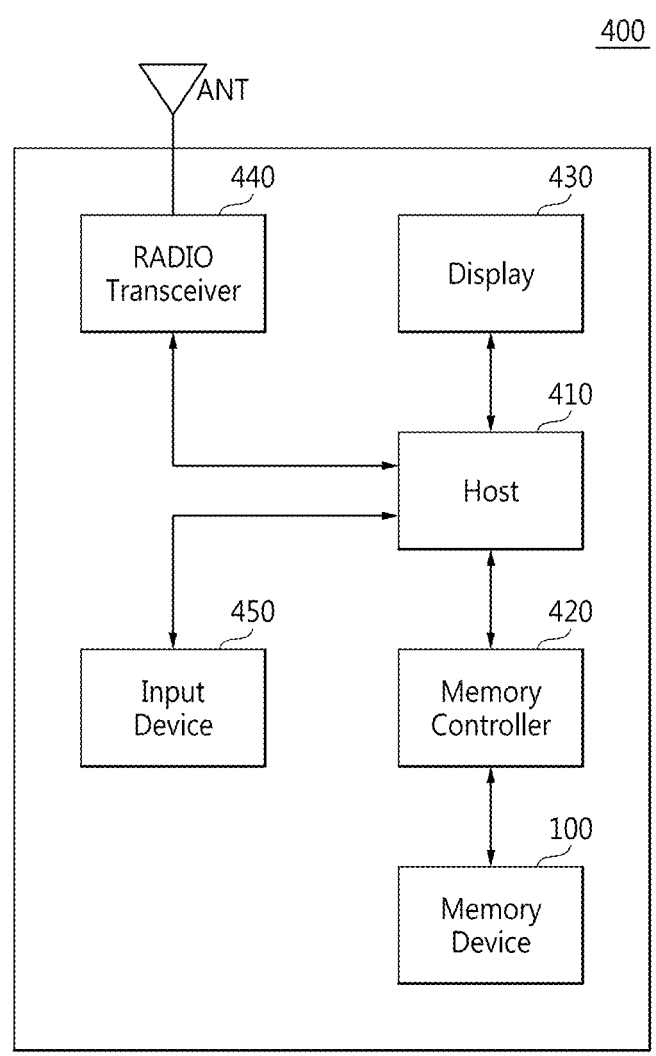
FIG. 11 is a block diagram illustrating a computer system including the memory device shown in FIG. 1 according to example embodiments.

FIG. 11 is a block diagram illustrating a computer system including the memory device shown in FIG. 1 according to example embodiments. Referring to FIGS. 1 and 11, a computer system 400 including the memory device 100 shown in FIG. 1 may be embodied in, for example, a cellular phone, a smart phone, a personal digital assistant (PDA), or a wireless communication device.

The computer system 400 includes the memory device 100 and a memory controller 420 which can control an operation of the memory device 100. The memory controller 420 may control a data access operation, e.g., a write operation or a read operation, of the memory device 100 according to a control of a host 410. The memory controller 420 may be the memory controller 300 shown in FIG. 1.

Data of the memory device 100 may be displayed through a display 430 according to a control of the host 410 and the memory controller 420. A wireless transceiver 440 may transmit or receive a wireless signal through an antenna ANT. For example, the wireless transceiver 440 may change a wireless signal received through the antenna ANT into a signal which can be processed by the host 410. Accordingly, the host 410 may process a signal output from the wireless transceiver 440, and transmit a processed signal to the memory controller 420 or the display 430. The memory controller 420 may store the signal processed by the host 410 in the memory device 100.

Moreover, the wireless transceiver 440 may change the signal output from the host 410 into a wireless signal, and output a changed wireless signal to an external device through the antenna ANT. An input device 450 is a device which can input a control signal for controlling an operation of the host 410 or data to be processed by the host 410, and may be embodied in a pointing device such as a touch pad and a computer mouse, a keypad, or a keyboard.

The host 410 may control an operation of the display 430 so that data output from the memory controller 420, data output from the wireless transceiver 440, or data output from the input device 450 may be displayed through the display 430.

According to an exemplary embodiment, the memory controller 420 which can control an operation of the memory device 100 may be embodied in a part of the host 410 or in a separate chip from the host 410.

Figure 12:
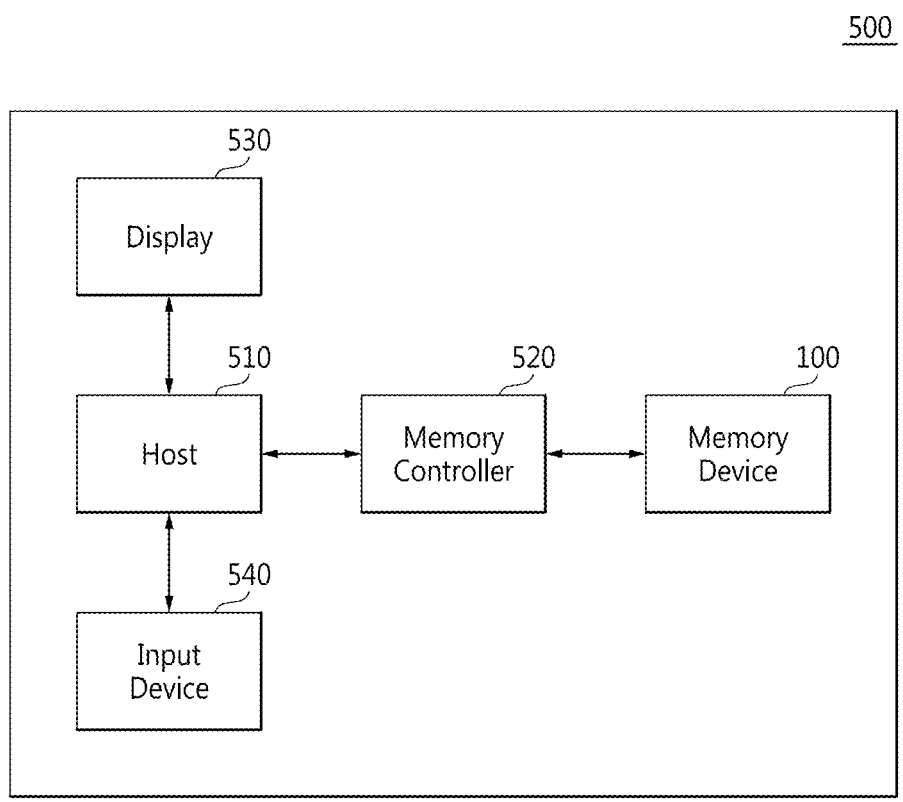
FIG. 12 is a block diagram illustrating a computer system including the memory device shown in FIG. 1 according to example embodiments.

FIG. 12 is a block diagram illustrating a computer system including the memory device shown in FIG. 1 according to example embodiments. Referring to FIGS. 1 and 12, a computer system 500 which includes the memory device 100 shown in FIG. 1 may be embodied in, for example, a personal computer (PC), a network server, a tablet PC, a net-book, an e-reader, a personal digital assistant (PDA), a portable multimedia player (PMP), an MP3 player, or an MP4 player.

A computer system 500 includes a host 510, the memory device 100, and a memory controller 520 which can control a data processing operation of the memory device 100, a display 530, and an input device 540.

The host 510 may display data stored in the memory device 100 through the display 530 according to data input through the input device 540. For example, the input device 540 may be embodied in a pointing device such as a touch pad or a computer mouse, a keypad, or a keyboard. The host 510 may control an entire operation of the computer system 500, and control an operation of the memory controller 520. The memory controller 520 may be the memory controller 300 shown in FIG. 1.

According to an exemplary embodiment, the memory controller 520 which can control an operation of the memory device 100 may be embodied in a part of the host 510 or in a separate chip from the host 510.

Figure 13:
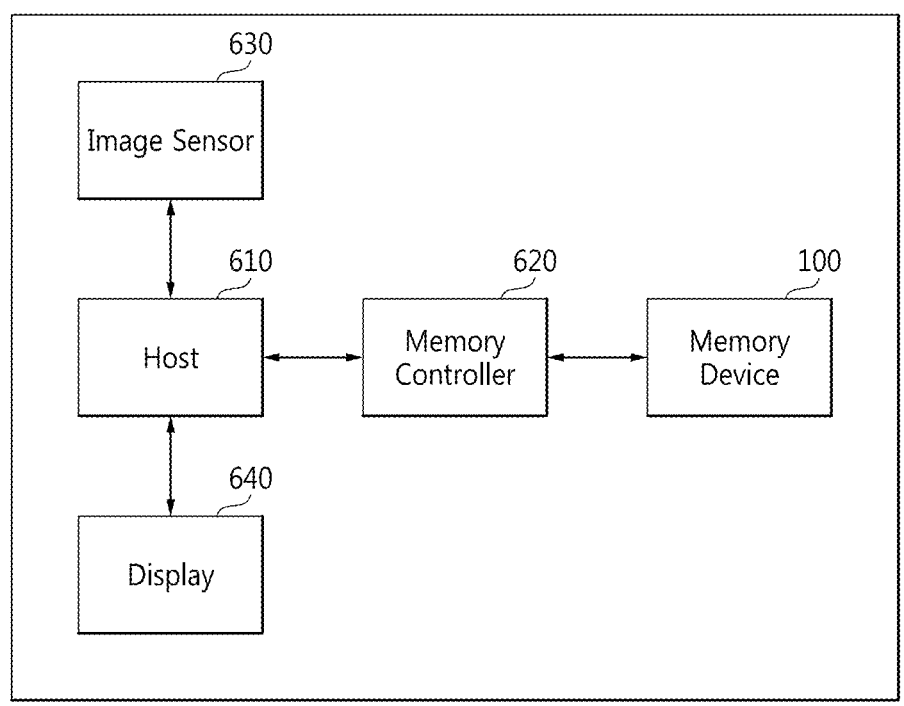
FIG. 13 is a block diagram illustrating a computer system including the memory device shown in FIG. 1 according to example embodiments.

FIG. 13 is a block diagram illustrating a computer system including the memory device shown in FIG. 1 according to example embodiments. Referring to FIGS. 1 and 13, a computer system 600 including the memory device 100 shown in FIG. 1 may be embodied in an image processing device, e.g., a digital camera or a cellular phone or a smart phone mounted with the digital camera.

The computer system 600 includes a host 610, the memory device 100, and a memory controller 620 which can control a data processing operation, e.g., a write operation or a read operation, of the memory device 100. Moreover, the computer system 600 further includes an image sensor 630 and a display 640.

The image sensor 630 of the computer system 600 converts an optical image into digital signals, and converted digital signals are transmitted to the host 610 or the memory controller 620. According to a control of the host 610, the converted digital signals may be displayed through a display 640, or may be stored in the memory device 100 through the memory controller 620. Moreover, data stored in the memory device 100 are displayed through the display 640 according to a control of the host 610 or the memory controller 620.

According to an exemplary embodiment, the memory controller 620 which can control an operation of the memory device 100 may be embodied in a part of the host 610, or may be embodied in a separate chip from the host 610. The memory controller 620 may be the memory controller 300 shown in FIG. 1.

Figure 14:
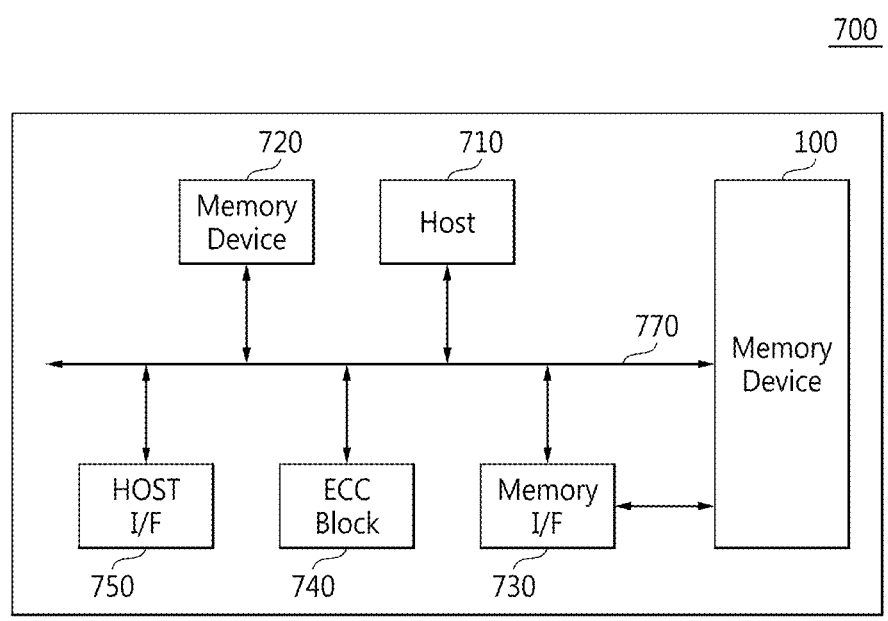
FIG. 14 is a block diagram illustrating a computer system including the memory device shown in FIG. 1 according to example embodiments.

FIG. 14 is a block diagram illustrating a computer system including the memory device shown in FIG. 1 according to example embodiments. Referring to FIGS. 1 and 14, a computer system 700 including the memory device 100 shown in FIG. 1 includes the memory device 100 and a host 710 which can control an operation of the memory device 100. Moreover, the computer system 700 further includes a system memory 720, a memory interface 730, an ECC block 740, and a host interface 750.

The computer system 700 includes a system memory 720 which can be used as an operation memory of the host 710. The system memory 720 may be embodied in a non-volatile memory such as a read only memory (ROM), and may be embodied in a volatile memory such as a static random access memory (SRAM). A host connected to the computer system 700 may perform data communication with the memory device 100 through the memory interface 730 and the host interface 750.

According to a control of the host 710, the error correction code (ECC) block 740 may detect an error bit included in data output from the memory device 100 through the memory interface 730, correct the error bit, and transmit error-corrected data to the host through the host interface 750. The host 710 may control data communication among the memory interface 730, the ECC block 740, the host interface 750, and the system memory 720 through a bus 770.

The computer system 700 may be embodied in a flash memory drive, a USB memory drive, an IC-USB memory drive, or a memory stick.

Figure 15:
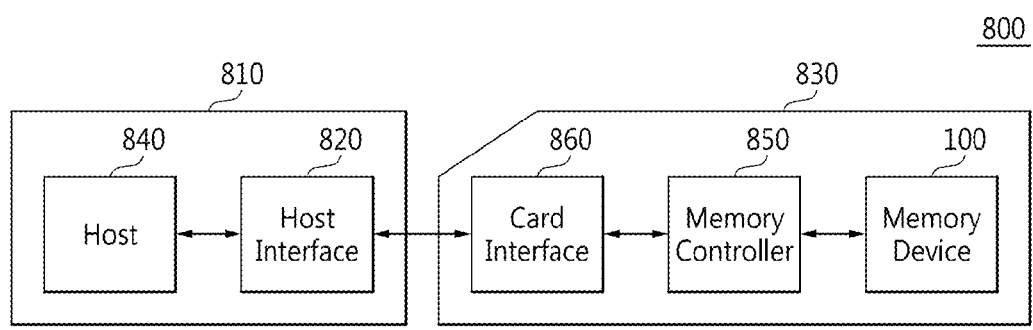
FIG. 15 is a block diagram illustrating a computer system including the memory device shown in FIG. 1 according to example embodiments.

FIG. 15 is a block diagram illustrating a computer system including the memory device shown in FIG. 1 according to example embodiments. Referring to FIGS. 1 and 15, a computer system 800 including the memory device 100 shown in FIG. 1 may be embodied in a host computer 810, and a memory card or a smart card. The computer system 800 includes the host computer 810 and a memory card 830.

The host computer 810 includes a host 840 and a host interface 820. The memory card 830 includes the memory device 100, a memory controller 850, and a card interface 860. The memory controller 850 may control data exchange between the memory device 100 and the card interface 860. The memory controller 850 may be the memory controller 300 shown in FIG. 1.

According to an exemplary embodiment, the card interface 860 may be a secure digital (SD) card interface or a multi-media card (MMC) interface; however, the card interface is not limited thereto. When the memory card 830 is installed in the host computer 810, the card interface 570 may interface data exchange between the host 840 and the memory controller 850 according to a protocol of the host 840.

According to an exemplary embodiment, the card interface 860 may support a universal serial bus (USB) protocol, and an interchip (IC)-USB protocol. Here, a card interface may mean hardware which can support a protocol used by the host computer 810, software mounted on the hardware, or a signal transmission mode.

When the computer system 800 is connected to the host interface 820 of the host computer 810 such as a PC, a tablet PC, a digital camera, a digital audio player, a cellular phone, console video game hardware, or a digital set-top box, the host interface 820 may perform data communication with the memory device 100 through the card interface 860 and the memory controller 850 according to a control of the host 840.

Figure 16:
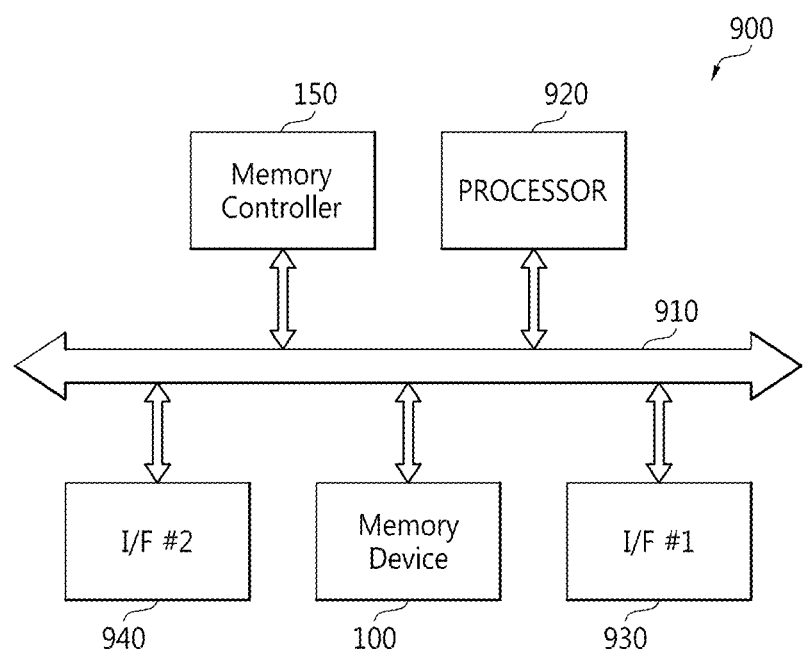
FIG. 16 is a block diagram illustrating a computer system including the memory device shown in FIG. 1 according to example embodiments.

FIG. 16 is a block diagram illustrating a computer system including the memory device shown in FIG. 1 according to example embodiments. Referring to FIGS. 1 and 16, a computer system 900 may include the memory device 100 connected to a data bus 910, a memory controller 150, a processor 920, a first interface 930, and a second interface 940.

According to an exemplary embodiment, the computer system 900 may include a portable device such as a cellular phone, an MP3 player (MPEG audio layer-3 player), an MP4 player (MPEG audio layer-4 player), a personal digital assistant (PDA), or a portable media player (PMP). According to another exemplary embodiment, the computer system 900 may include a data processing system such as a personal computer (PC), a notebook-sized personal computer, or a laptop computer. According to still another exemplary embodiment, the computer system 900 may include a memory card such as a secure digital (SD) card or a multi media card (MMC). According to still another exemplary embodiment, the computer system 900 may include a smart card or a solid state drive (SSD).

The memory device 100, the memory controller 150, and the processor 920 may be embodied in one chip, e.g., a system on chip (SoC), and may be embodied in separate independent devices according to an exemplary embodiment.

According to an exemplary embodiment, the processor 920 may process data input through the first interface 930 to write the data in the memory device 100. According to an exemplary embodiment, the processor 920 may read data stored in the memory device 100 to output the data to the outside through the first interface 930. In this case, the first interface 930 may be an input/output device. A second interface 940 may be an interface for wireless communication. According to an exemplary embodiment, the second interface 940 may be embodied in software or firmware.

Figure 17:
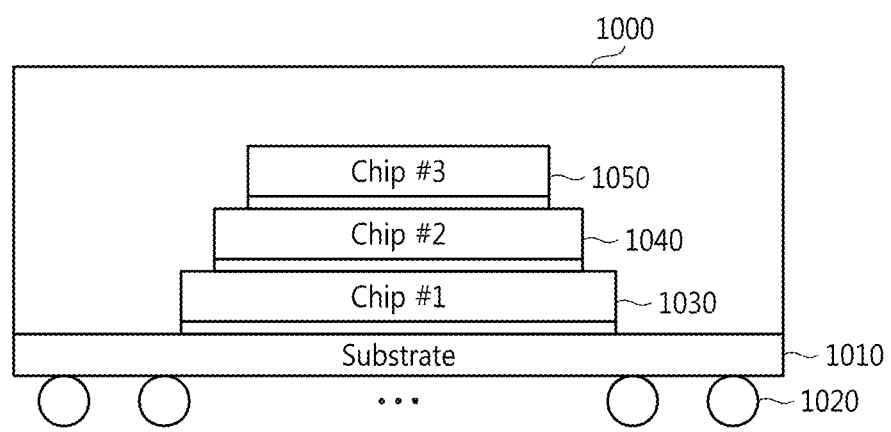
FIG. 17 is a conceptual diagram which schematically shows a multi-chip package including the memory device shown in FIG. 1 according to example embodiments.

FIG. 17 is a conceptual diagram which schematically shows a multi-chip package including the memory device shown in FIG. 1 according to example embodiments. Referring to FIGS. 1 and 17, a multi-chip package 1000 may include a plurality of semiconductor devices 1030 to 1050, Chip #1 to Chip #3 which are sequentially stacked on a package substrate 1010. Each of the plurality of semiconductor devices 1030 to 1050 may include the memory device 100 described above. The memory controller (not shown) for controlling an operation of each of the plurality of semiconductor devices 1030 to 1050 may be equipped inside one or more of the plurality of semiconductor devices 1030 to 1050, or may be embodied on the package substrate 1010. For electrical connection between the plurality of semiconductor devices 1030 to 1050, a through-substrate via (e.g., a through-silicon via (TSV: not shown)), a connection line (not shown), a bump (not shown), a solder ball 1020, and the like may be used. The memory controller (not shown) may be the memory controller 300 shown in FIG. 1.

As an example, a first semiconductor device 1030 is a logic die and includes an input/output interface device and a memory controller, and a second semiconductor device 1040 and a third semiconductor device 1050 are dies to which a plurality of memory devices are stacked and include a memory cell array, respectively. For example, the second semiconductor device 1040 and the third semiconductor device 1050 may be the same type of memory device, or may be different types of memory devices according to an exemplary embodiment.

As another example, each of the first semiconductor device to the third semiconductor device 1030 to 1050 may include a memory controller. For example, the memory controller may be on the same die as a memory cell array, or may be on a die different from the memory cell array. As still another example, the first semiconductor device 1030 may include an optical interface device. The memory controller may be positioned in the first semiconductor device 1030 or the second semiconductor device 1040, and the memory device is positioned in the second semiconductor device 1040 or the third semiconductor device 1050 to be connected to the memory controller and the through-silicon via (TSV).

Moreover, the exemplary embodiments may be embodied as a hybrid memory cube (HMC) of a structure in which the memory controller and the memory cell array die are stacked. It is possible to improve performance of the memory device due to an increase in bandwidth by embodying the exemplary embodiments as the HMC, and to reduce power consumption and manufacturing cost by minimizing an area occupied by the memory device.

Figure 18:
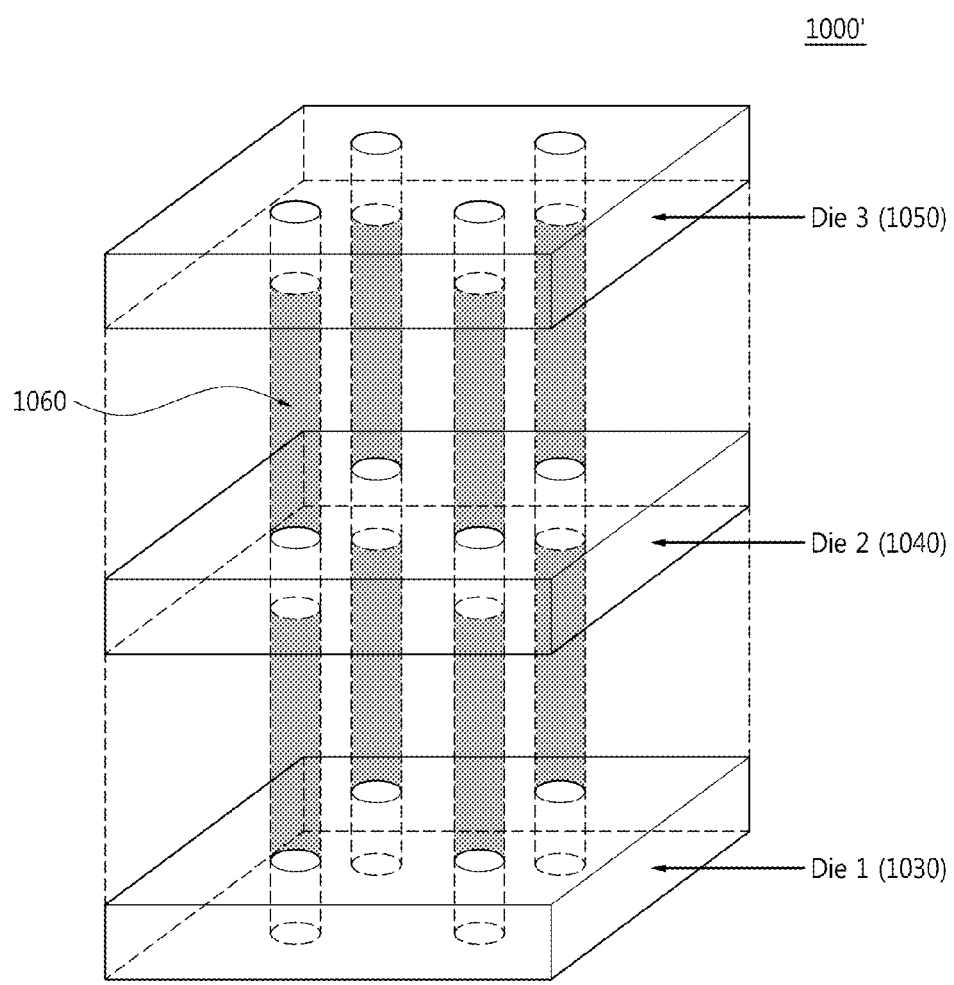
FIG. 18 is a conceptual diagram which three-dimensionally shows the multi-chip package shown in FIG. 17 according to example embodiments.

FIG. 18 is a conceptual diagram which three-dimensionally shows the multi-chip package shown in FIG. 17 according to example embodiments. Referring to FIGS. 1, 17, and 18, a multi-chip package 1000' includes a plurality of dies Die 1 to 3, 1030 to 1050 of a stack structure which are connected to each other through the through-silicon via (TSV) 1060. Each of the dies Die 1 to 3, 1030 to 1050 may include a plurality of circuit blocks (not shown) for embodying a function of the memory device 100, and a periphery circuit. The dies 1030 to 1050 may be referred to as a cell layer, and a plurality of circuit blocks may be embodied in a memory block.

The through-silicon via (TSV) 1060 may be formed of a conductive substance including a metal such as Cu and the like, and disposed in a center of a silicon substrate, and the silicon substrate has a structure of surrounding the through-silicon via (TSV) 1060. An insulation region (not shown) may be disposed between the through-silicon via (TSV) 1060 and the silicon substrate.

A memory device according to an exemplary embodiment of the present disclosure adjusts a time point at which a word line in a corresponding bank is disabled after receiving a pre-charge command for the corresponding bank, and thereby cell data write time of the memory device can be increased. The memory device according to an exemplary embodiment of the present disclosure may perform an active operation after checking whether or not a pre-charge operation has ended.

Although a few embodiments of the present disclosure have been shown and described, it will be appreciated by those skilled in the art that changes may be made in these embodiments without departing from the principles and spirit of the general inventive concept, the scope of which is defined in the appended claims and their equivalents.

What is claimed is:

1. A memory device including a plurality of banks, comprising:
   a pre-charge control circuit configured to receive an active command after receiving a pre-charge command for a first bank of the plurality of banks, determine whether or not a pre-charge operation for the first bank has ended when receiving the active command, and generate an active instruction signal according to a result of the determination;
   an active control circuit configured to generate an active control signal for an active operation according to the active instruction signal; and
   a driver circuit configured to control the active operation according to the active control signal.

2. The memory device of claim 1, wherein the pre-charge control circuit is configured to receive the active command for the first bank,
   wherein the active control circuit is configured to generate the active control signal for the first bank, and
   wherein the driver circuit is configured to control the active operation on the first bank.

3. The memory device of claim 2, wherein the pre-charge control circuit is configured to generate a pre-charge control signal for the first bank according to the pre-charge command or the active command, and
   wherein the driver circuit is configured to control the pre-charge operation for the first bank according to the pre-charge control signal.

4. The memory device of claim 2, wherein the pre-charge control circuit is configured to, when a first time point at which the active command is received leads ahead of a second time point at which a pre-charge end signal which represents an end of the pre-charge operation is received, generate the active instruction signal which instructs performance of the active operation after performing the pre-charge operation.

5. The memory device of claim 2, wherein the pre-charge control circuit is configured to, when the first time point at which the active command is received lags behind the second time point at which a pre-charge end signal which represents an end of the pre-charge operation is received, generate the active instruction signal which instructs immediate performance of the active operation according to the active command.

6. The memory device of claim 2, wherein the active control circuit is configured to generate the active control signal which instructs performance of the active operation after performing the pre-charge operation when the active instruction signal is at a first level, and generate the active control signal which instructs to immediately perform the active operation when the active instruction signal is at a second level opposite to the first level.

7. The memory device of claim 2, wherein the driver circuit is configured such that a first word line signal on a first word line of the first bank is disabled when the pre-charge operation is started, and
wherein the driver circuit is configured such that a second word line signal on a second word line of the first bank is enabled when the pre-charge operation has ended.

8. The memory device of claim 2, wherein the driver circuit includes:
a word line driver configured to enable a first word line signal for a first word line of the first bank according to the active control signal, and disable a second word line signal for a second word line of the first bank according to the pre-charge control signal, and
a sensing driver configured to enable a bit line sensing signal for a bit line sense amplifier according to the active control signal, and disable the bit line sensing signal according to the pre-charge control signal.

9. The memory device of claim 1, wherein the memory device is configured such that when receiving the active command for a second bank of the plurality of banks after receiving the pre-charge command for the first bank, the memory device does not determine whether or not the pre-charge operation for the first bank has ended.

10. A memory device including a plurality of memory cells connected to a plurality of word lines, comprising:
a pre-charge control circuit configured to receive a pre-charge command and an active command received after the pre-charge command, and inactivate a first word line of the plurality of word lines;
an active control circuit configured to activate the first word line or a second word line of the plurality of word lines in response to the active command,
wherein the pre-charge control circuit is configured to inactivate the first word line at variable times based on a time of receiving the active command.

11. The memory device of claim 10, wherein the memory device is configured such that:
when the active command is received after a reference time from receiving the pre-charge command, the pre-charge control circuit inactivates the first word line in response to the pre-charge command, and
when the active command is received before the reference time from receiving the pre-charge command, the pre-charge control circuit inactivates the first word line in response to the active command.

12. The memory device of claim 10, wherein the memory device is configured such that:
when the active command is received after a reference time from receiving the pre-charge command, the pre-charge control circuit inactivates the first word line after a first delay time from receiving the pre-charge command, and
when the active command is received before the reference time from receiving the pre-charge command, the pre-charge control circuit inactivates the first word line after a second delay time shorter than the first delay time from receiving the pre-charge command.

13. The memory device of claim 10, wherein the memory device is configured such that:
when the active command is received before a reference time from receiving the pre-charge command:
when memory cells connected to each of the first and second word lines are included in the same bank, the pre-charge control circuit inactivates the first word line in response to the active command; and
when the memory cells connected to each of the first and second word lines are included in a different bank, the pre-charge control circuit inactivates the first word line in response to the pre-charge command.

14. The memory device of claim 10, wherein the memory device is configured such that:
when the active command is received before a reference time from receiving the pre-charge command:
when memory cells connected to each of the first and second word lines are included in the same bank, the pre-charge control circuit inactivates the first word line after a first delay time from receiving the pre-charge command; and
when the memory cells connected to each of the first and second word lines are included in a different bank, the pre-charge control circuit inactivates the first word line after a second delay time shorter than the first delay time from receiving the pre-charge command.

15. The memory device of claim 10, wherein the memory device is configured such that:
when the active command is received before a reference time from receiving the pre-charge command:
when memory cells connected to each of the first and second word lines are shared by a bit line sense amplifier, the pre-charge control circuit inactivates the first word line in response to the active command; and
when the memory cells connected to each of the first and second word lines are not shared by the bit line sense amplifier, the pre-charge control circuit inactivates the first word line in response to the pre-charge command.

16. A memory device including a memory cell array having a plurality of memory cells connected to a plurality of word lines, comprising:
a pre-charge control circuit configured to receive a pre-charge command and an active command received after the pre-charge command, and inactivate a first word line of the plurality of word lines;
an active control circuit configured to activate the first word line or a second word line of the plurality of word lines in response to the active command, wherein the pre-charge control circuit is configured such that a time for inactivating the first word line is variable based on a location of memory cells connected to the second word line.

17. The memory device of claim 16, wherein the memory device is configured such that:
when memory cells connected to each of the first and second word lines are included in the same bank of the memory cell array, the pre-charge control circuit inactivates the first word line in response to the active command, and
wherein when the memory cells of each of the first and second word lines are included in a different bank of the memory cell array, the pre-charge control circuit inactivates the first word line in response to the pre-charge command.

18. The memory device of claim 16, wherein the memory device is configured such that:
when memory cells of each of the first and second word lines are shared by a bit line sense amplifier, the pre-charge control circuit inactivates the first word line in response to the active command, and
wherein when the memory cells of each of the first and second word lines are not shared by the bit line sense amplifier, the pre-charge control circuit inactivates the first word line in response to the pre-charge command.

19. The memory device of claim 16, wherein the memory device is configured such that:
when memory cells of each of the first and second word lines are included in the same bank of the memory cell array, the pre-charge control circuit inactivates the first word line after a first delay time from receiving the pre-charge command, and
when the memory cells of each of the first and second word lines are included in a different bank of the memory cell array, the pre-charge control circuit inactivates the first word line after a second delay time greater than the first delay time from receiving the pre-charge command.

20. The memory device of claim 16, wherein the memory device is configured such that:
when memory cells of each of the first and second word lines are shared by a bit line sense amplifier, the pre-charge control circuit inactivates the first word line after a first delay time from receiving the pre-charge command, and
when the memory cells of each of the first and second word lines are not shared by the bit line sense amplifier, the pre-charge control circuit inactivates the first word line after a second delay time greater than the first delay time from receiving the pre-charge command.

* * * * *